United States Patent [19]

Briefer

[11] Patent Number: 5,194,819
[45] Date of Patent: Mar. 16, 1993

[54] LINEARIZED CAPACITANCE SENSOR SYSTEM

[75] Inventor: Dennis K. Briefer, Berlin, Mass.

[73] Assignee: Setra Systems, Inc., Acton, Mass.

[21] Appl. No.: 565,929

[22] Filed: Aug. 10, 1990

[51] Int. Cl.$^5$ .................... G01N 27/26; G01L 9/12
[52] U.S. Cl. .................. 324/684; 324/678; 324/662; 73/718
[58] Field of Search ............ 324/684, 678, 676, 661, 324/662, 725, 679, 680; 73/718, 724; 341/118

[56] References Cited

U.S. PATENT DOCUMENTS

| | | | |
|---|---|---|---|
| 4,683,754 | 8/1987 | Hirata et al. | 73/718 X |
| 4,791,352 | 12/1988 | Frick et al. | 73/724 X |
| 4,831,325 | 5/1989 | Watson, Jr. | 324/678 |
| 4,878,012 | 10/1989 | Schulte et al. | 324/678 |
| 4,975,700 | 12/1990 | Tan et al. | 341/118 |

Primary Examiner—Jack B. Harvey
Attorney, Agent, or Firm—Lahive & Cockfield

[57] ABSTRACT

A capacitive sensing circuit and system includes a variable capacitance sensing element as an active element in a circuit to measure changes in capacitance of the sensing element. A switching network in alternate cycles energizes a capacitor to develop a charge which effectively linearizes the sensor's capacitance response. In a push-pull circuit with two active sensing elements, a multi-channel switching network energizes two fixed correction capacitors to provide third or higher order correction, significantly extending the effective scale of the sensor. In a preferred embodiment, a single feedback signal is applied to all capacitors in different switching cycles. Examples include weight and pressure sensing systems.

12 Claims, 3 Drawing Sheets

LINEARIZED CAPACITANCE SENSOR SYSTEM

BACKGROUND

In systems for sensing a physical parameter, a capacitive sensing element is commonly used wherein a plate or diaphragm moves in response to a force, pressure or temperature change. The change of plate position varies the width of a dielectric gap, changing the capacitance of the sensing element. The variation in dielectric gap is a function of the physical parameter which is fully determined by the mechanics of the device, and may be readily modeled or empirically measured. Moreover, the variation in capacitance may be a linear function of the change in gap, so that by measuring a change in capacitance of the sensor one effectively measures the desired physical parameter.

In practice, the change in capacitance is measured by incorporating the sensor as an active element of a circuit, and measuring the change in frequency, phase or magnitude of a signal applied to or formed by the circuit. Applicant's earlier U.S. Pat. No. 4,054,833 shows circuitry of this type, wherein the measurement circuitry employs a reference capacitor element in series with a capacitive sensing element. A switching circuit cyclically applies different voltages to the reference and to the sensing elements, and a feedback circuit adjusts one voltage so that the signal at the junction of the two elements is maintained substantially at a fixed value. The value of the feedback voltage necessary to achieve a stationary signal in the circuit is representative of the capacitance value. Applicant's aforesaid U.S. patent shows a circuit wherein the feedback signal is a linear function of sensor plate displacement.

In prior art circuits, it is advantageous to employ as a sensor a central diaphragm type sensor with the two opposed sides forming the basic capacitance measurement network. In such a sensor, a change in gap of one side caused by motion of the diaphragm produces an equal and oppositely-directed change in gap of the other side. In that case the reference and source capacitance each vary. However, since to a first approximation the changes in the two capacitances are substantially equal and opposite, the net variation is greater than for a single-sided sensor. Thus, when such a push-pull sensing network is employed, the symmetry of the network results in a sensitive determination of the position of the central diaphragm for small displacements.

In practice, a variable capacitance sensing element is a physical structure of plates, housing conductive leads, spacers and the like which have a certain amount of leakage. This leakage capacitance introduces non-linearities into the measurement network. Other non-linearities are also presented, due to non-parallelism of the plates, departures from plate flatness, change in diaphragm stiffness at larger displacements, and other physical factors. In the case of a push-pull capacitive sensor, each side of the sensor contributes its own parasitic or leakage capacitance, in addition to the other non-linearities and variations due to diaphragm displacement. For larger displacements, the added leakage capacitances and non-linearities limit the range of the parameter that can be effectively measured by the sensor circuitry.

Therefore it is desirable to correct the effects of sensor capacitance non-linearity and to extend the range of accuracy of a sensing circuit.

SUMMARY OF THE INVENTION

Accordingly it is an object of the invention to provide a capacitive sensor circuit which compensates for leakage capacitance of the sensor element.

It is a further object to provide such a circuit wherein two variable plate-gap capacitors each having a characteristic leakage are placed in series and cyclically energized with reference voltages to develop a stationary signal at their junction.

It is another object of the invention to provide a capacitive sensing circuit wherein a non-linearity is corrected by applying a feedback signal out of phase to a compensating capacitor in a manner to develop a charge opposite to the charge caused by non-linearity of a variable capacitance sensing element.

These and other desirable properties are obtained in a basic embodiment of the invention by a capacitive sensing circuit wherein a first switching network cyclically applies one or more reference voltages to each of a pair of series-connected capacitors, at least one of which is a variable capacitor having a characteristic leakage or non-linearity, and a second or the same switching network applies one of the reference voltages in alternate switching cycles to a third capacitor in circuit communication with the variable capacitor to cyclically develop a compensating charge. The compensating charge developed by the third capacitor balances out the charge due to the leakage or other non-linear effects of the variable capacitor. In a preferred embodiment, both capacitors of the pair are variable, and additional switching elements of the network are provided to alternately apply a voltage to a fourth capacitor which is charged to compensate for a leakage or non-linear effects of the second variable capacitor. Preferably, a feedback network provides a single feedback voltage which is applied as a reference signal in different cycles to all capacitors to maintain a fixed voltage in the circuit. The feedback signal is preferably a substantially linear function of the variation in sensing gap.

BRIEF DESCRIPTION OF THE DRAWINGS

These and other aspects of the invention will be understood by reference to the description appearing below and the drawings forming a part of this application, wherein.

DETAILED DESCRIPTION OF THE DRAWINGS

Figure 1:
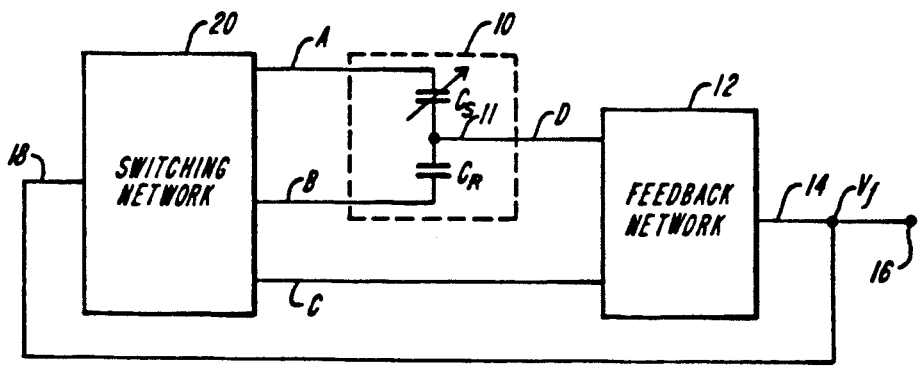
FIGS. 1 and 2 show prior art capacitance sensing circuits.

FIG. 1 schematically illustrates a prior art capacitive sensing system as shown in applicant's aforesaid U.S. patent. In that Figure, a sensor network 10 includes a sensing capacitor $C_S$, which has a variable capacitance which functionally depends on a sensed physical parameter, and which is connected in series to a reference capacitor $C_R$. The junction point 11 between these capacitors is connected by way of signal line D as a first input to a feedback network 12 which provides a feedback signal $V_f$ by way of line 14 to an output terminal 16 and by way of feedback terminal 18 to a switching network 20. Network 20 provides one or more voltage signals, including at least the feedback signal $V_f$, along lines A and B to the sensor network 10, and along line C to the feedback network 12. For example, the switching network 20 may, in alternate switching cycles, apply $V_f$ to line A while grounding line B, then apply $V_f$ or a constant voltage to line B while grounding line A, to charge and drain each capacitor. This causes an alternating current to flow across the junction point 11. By sampling the junction voltage after switching, the circuit detects an instantaneous voltage which provides an indication of the direction and amount of change of the value $C_S$.

Figure 2:
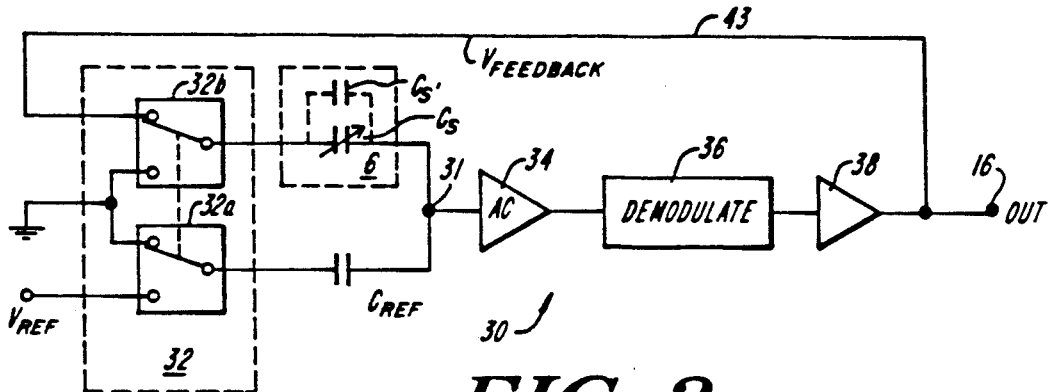

FIG. 2 shows in somewhat greater detail a practical embodiment of a conventional circuit 30 for determining the capacitance of a variable capacitance sensing element. In this circuit, sensing element 6, acting as a sensing capacitor $C_S$, is placed in series with a fixed reference capacitor denoted $C_{REF}$. A switching unit 32 consists of a reference switch 32a and a sensor switch 32b which, in alternate switching cycles, first apply a constant reference voltage $V_{ref}$ to $C_{REF}$ while grounding the sensor $C_S$, then apply a feedback voltage $V_{feedback}$ to the sensor while grounding $C_{REF}$. This periodic reversal of polarity along the two legs of the series connection of $C_{REF}$ and $C_S$ results in a current flow of changing polarity across their junction 31, i.e., creates a varying AC signal at the junction 31 of the sensor $C_S$ and the fixed capacitor $C_{REF}$.

This signal is amplified, demodulated, and processed by amplifiers 34, 38 and demodulator 36 to produce a feedback voltage on line 43 of a magnitude that maintains the signal at 31 stationary, and preferably null. The demodulator may include a gated sampling circuit which detects the signal voltage during a selected time interval following switching. The feedback loop raises or lowers $V_{feedback}$ to maintain the sampled signal value at junction 31 stationary. The feedback voltage also appears at output junction 16a as a weight-indicating output signal.

Ideally, the capacitance $C_S$ of sensor 6 varies linearly with the force applied to the sensor, but in practice some leakage capacitance exists in parallel between the two terminals of the sensor and other non-linearities are introduced by such conditions as physical irregularities in or misalignment of the electrodes, which render the response of $C_S$ non-linear. An equivalent capacitance which approximates the effect of the non-linearities or leakage capacitance is indicated in phantom in FIG. 2 by $C_S'$. The value of the capacitance $C_S'$ may be as great as one third or more of the value of $C_S$ and its contribution becomes increasingly important as diaphragm displacement increases, i.e., as $C_S$ decreases from its value in the sensor's relaxed state.

Figure 3:
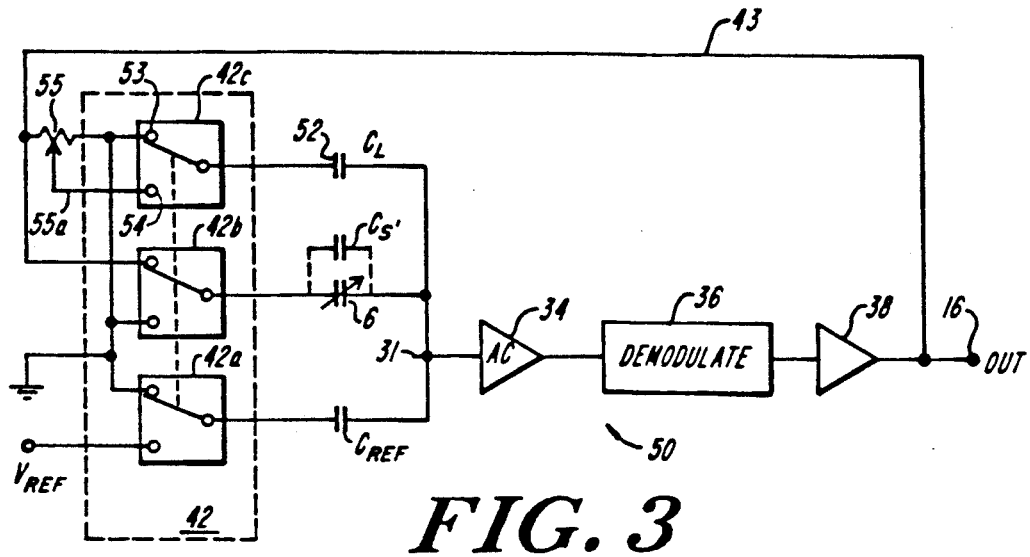
FIG. 3 shows a basic capacitance sensing circuit according to the present invention.

FIG. 3 shows a capacitance measuring circuit 50 according to the present invention, which solves this problem by effectively providing a negative capacitance to compensate for the leakage capacitance $C_S'$. This is achieved by providing an additional fixed capacitor 52, denoted $C_L$ connected to the sensor element 6, where the capacitance of correction capacitor 52 is selected to approximate the "leakage" or, more accurately, to compensate for the non-linearities of capacitance of the sensor. A switching network 42 then grounds the capacitor $C_L$ while the sensor is charging, and charges $C_L$ while the sensor is grounded, thereby providing a charge of opposite polarity which may provide a reference point for the capacitance charge measurement. The switched pair of capacitors 52, 6 therefore behaves like a single capacitor of capacitance $C_S$ which varies linearly with plate gap displacement, with no apparent leakage. With this additional switched element at the sensor-capacitor input bridge, the demodulator and feedback loop without further changes develops a control voltage which is a linear function of sensor plate gap.

Switching network 42 includes first and second switching units 42a, 42b the connection and operation of which is identical to that described above for switching units 32a, 32b. The leakage compensation capacitor 52, denoted $C_L$, selected as described above, is connected between junction 31 and an additional switching unit 42c. Unit 42c operates synchronously with switches 42a, 42b to switch between two terminals 53, 54 which are connected to ground and, via trimmer potentiometer 55, to the $V_{feedback}$ line 43. The ground and feedback lines of switch 42c are reversed from those of switch 42b.

If the leakage correction capacitor 52 is exactly equal to the apparent leakage capacitance $C_S'$ of the sensor 6, potentiometer 55 may be omitted. In practice, however, the apparent leakage of each sensor may vary from a nominal value, due to variations in spacings, alignments and dimensions of different components of the sensor. Further, the leakage capacitance may not be exposed to the full magnitude of $V_{feedback}$ due to voltage dividing resistances of the different components of the sensor responsible for the leakage. Thus, the potentiometer allows a linear adjustment of the proportion of the voltage of line 43 which is applied to $C_L$, and by setting the proportion initially one may more accurately offset the sensor charge that is due to such leakage in each cycle.

Figure 4A:
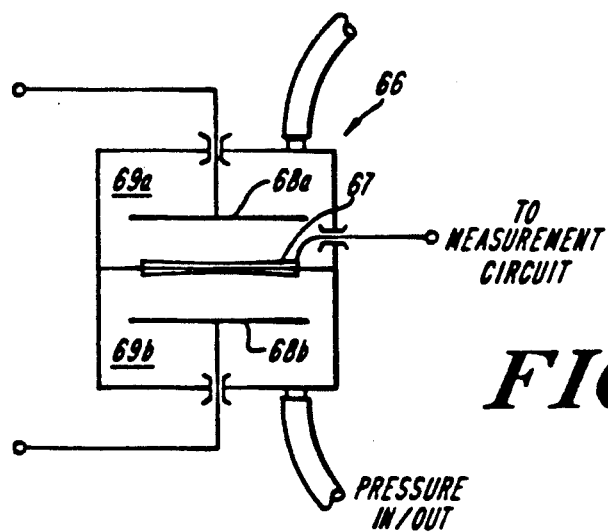
FIGS. 4A and 4B illustrate a push-pull sensor and a circuit with two active sensing elements, respectively.
Figure 4B:
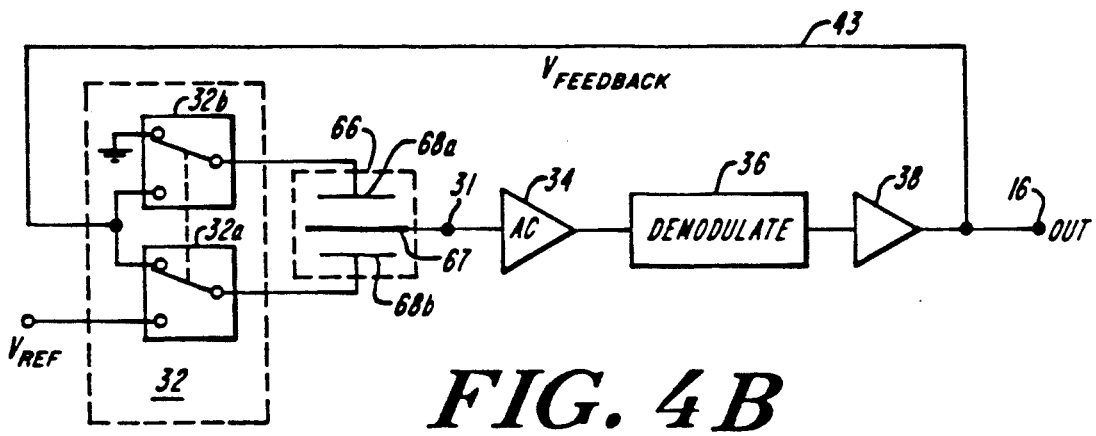

A second embodiment of a sensor circuit according to the invention employs a sensing unit 66 as shown in FIG. 4A, with a central capacitance-defining movable sensing member 67 which divides a surrounding housing into a closed chamber 69a and a sensing chamber 69b containing respective fixed plates 68a, 68b which each define a gap across a dielectric from the diaphragm. An increase in plate gap in one chamber 69a results in a decrease in plate gap of equal magnitude in the adjacent chamber 69b. Such a sensor is typically employed, for example, as a manometer or pressure sensor. Such a sensor may be connected in a prior art sensing circuit substantially as shown in FIG. 2, in the manner illustrated in FIG. 4B. The two oppositely varying halves of a single sensor unit 66, namely 66a, 66b, are attached as the $C_S$ and $C_{REF}$ of FIG. 2. When connected in this push-pull manner, the difference in capacitance between the two capacitors is approximately twice that due to the gap change in the sensor. However, in this case, each side of the sensor has a leakage capacitance which introduces a predominantly third order non-linearity into the sensing network of FIG. 4B. That is, rather than a linear increase in feedback voltage to balance a change in sensor diaphragm displacement and produce a null signal at junction 31, the feedback voltage required to produce a null signal differs from linearity by an amount which is negative for a positive gap change, and positive for negative gap change. A third order correction of this type is not achieved by a simple feedback path in the signal processing and amplifier circuitry.

Figure 5:
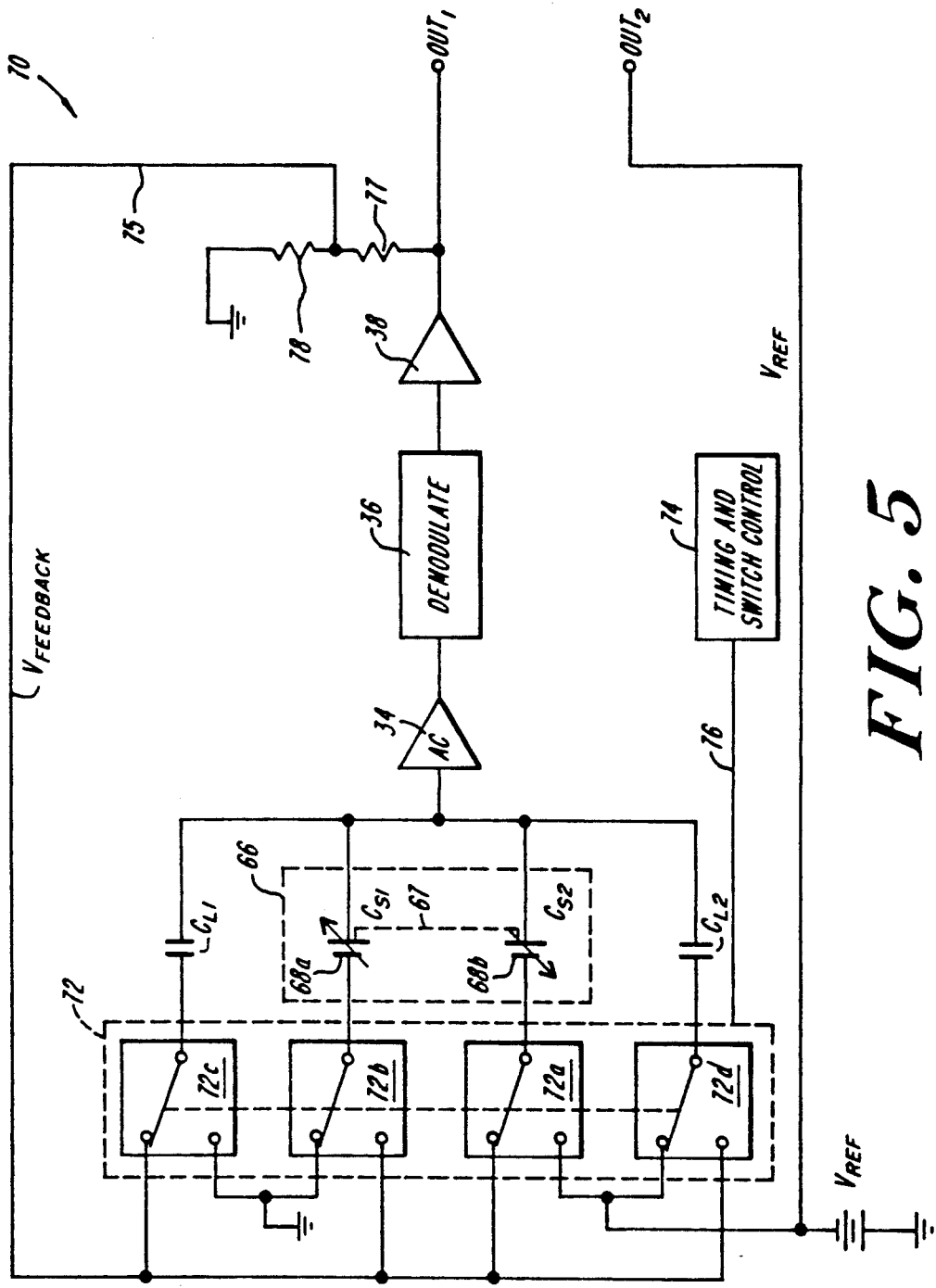
FIG. 5 shows a second embodiment of a system according to the invention, having a push-pull sensor configuration.

To remove this third order effect, and provide a feedback signal, the embodiment 70 of the invention as shown in FIG. 5 employs two fixed correction capacitors $C_{L1}$ and $C_{L2}$ to correct the two sides $C_{S1}$ an $C_{S2}$ of the push-pull sensor 66. A switching network 72 in synchronized switching cycles alternately applies a Single feedback voltage along line 75 to a first end of each capacitor $C_{L1}$, $C_{S2}$ in one cycle and $C_{L2}$, $C_{S1}$ in the alternate cycle, while applying different reference voltages to the first end of each capacitance $C_{L1}$, $C_{S1}$, $C_{L2}$, $C_{S2}$ in their respective non-feedback cycles. A timing and switch control unit 74 applies a synchronizing signal along line 76 to operate the switch network 72. Network 72 uses preferably CMOS analog multi-channel multiplexers, such as one of the MM54HC4051 family of CMOS chips made by National Semiconductor. A binary word control signal on line 76 effects the synchronized four-channel, two-state switching described below.

Switching network 72 includes four single-throw switches 72a, 72b, 72c, 72d each having first and second states indicated by their upper and lower input terminals, respectively, as they appear on the left side in FIG. 5. The switches 72a, 72b, 72c and 72d are connected to the first ends of capacitors $C_{S2}$, $C_{S1}$, $C_{L1}$ and $C_{L2}$, respectively. The second end of each capacitor is connected to sensing junction 31. All switches are connected in their first state in a first switching cycle, and in their second state in a second switching cycle.

As shown, in the first cycle, $V_{feedback}$ is applied to $C_{L1}$ and $C_{S2}$ while $C_{S1}$ and $C_{L2}$ connect to ground and to $V_{ref}$, respectively. In the alternate, or second switching cycle, $V_{feedback}$ is applied to $C_{S1}$ and $C_{L2}$, while $C_{L1}$ and $C_{S2}$ are connected to ground and to $V_{ref}$, respectively. Thus, a single feedback voltage is applied along line 75 to all four capacitance units, the two active sensors and the two leakage correction elements. The elements of one side of the network, $C_{S2}$ and $C_2$, are energized with the fixed reference voltage $V_{ref}$, while the elements of the other side of the network $C_{S1}$ and $C_{L1}$ are connected to ground, in alternation with their connection to $V_{feedback}$. The feedback voltage on line 75 is a fixed fraction of the output signal from the amplifier 38 determined by voltage dividing resistors 77,78 connected between output terminal $OUT_1$ and ground. The second output terminal $OUT_2$ is maintained at the reference potential to provide a difference in potential between the two output terminals which is a linear function of plate gap displacement, corrected for the non-linear effects of each side of the push-pull sensor.

The circuit and system of FIG. 5 thus provides a push-pull capacitance sensing circuit with two active sensing elements connected in a common mode for linearizing a sensor output, and having a pair of possibly different effectively negative capacitances switched into the circuit in push-pull for effectively cancelling higher order effects due to leakage, misalignment and the like. With this improvement, a single processing and demodulation channel provides a linear sensor output over an extended range.

The non-linearity effect corrected by the present invention has been primarily described with reference to leakage capacitances or the non-linearities which occur for large displacements of a central diaphragm. However, it will be appreciated that in modeling the change in capacitance with variation in the position of a sensing electrode, numerous physical arrangements can give rise to higher-order non-linearities which are all corrected in accordance with the present invention by switching-in a "negative capacitance" of a magnitude selected to compensate for the magnitude of the departure from linearity.

Figure 6A:
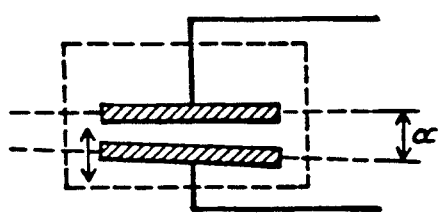
FIGS. 6A–6C show sensor defects or unusual geometries which are corrected by systems according to the invention.
Figure 6B:
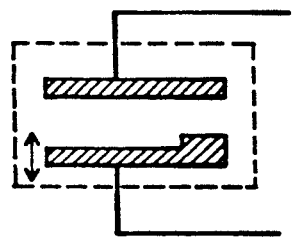
Figure 6C:
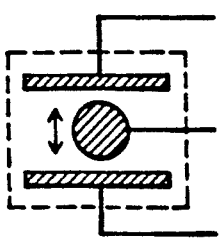

FIGS. 6A–6C illustrate examples of electrode configurations giving rise to such non-linear capacitance characteristics. In the single capitance sensors shown in FIGS. 6A and 6B, the non-linearities arise from the angular misalignment of a plate (FIG. 6A) or from a stepped plate having rigidly coupled regions of different gap (FIG. 6B). In the two-capacitor sensor of FIG. 6C, the non-linearity arises from an irregularly-shaped (e.g., spherical) movable electrode, rather than a conventional parallel plate electrode or central diaphragm.

The invention being thus described with reference to several particular embodiments, various substitutions and modifications of the described embodiments will occur to those skilled in the field, and all such substitutions and modifications are considered within the scope of the invention.

What is claimed is:

1. A capacitive sensing circuit comprising
   a first and a second capacitor with one end of each capacitor connected to a junction, at least said second capacitor being a sensing capacitor having a capacitance which varies in accordance with physically-induced change in plate position and which has a non-linear capacitance characteristic,
   first switching means for applying signals to non-common ends of said first and second capacitors in alternate switching cycles for developing a flow of charge through said capacitors such that the voltage present at the junction varies in functional dependence on the capacitance values of said first and second capacitors,
   a third capacitor having one end coupled to said junction,
   second switching means for coupling a signal to the non-common end of said third capacitor to develop a charge effective to substantially null the charge variation due to said non-linear capacitance characteristic of the sensing capacitor, and
   feedback means responsive to the voltage at said junction for providing a feedback signal to said first switching means to charge at least said second capacitor and maintain stationary the voltage present at the junction.

2. A circuit according to claim 1, further comprising
   a fourth capacitor having one end coupled to said junction, and
   third switching means for coupling a signal to another end of said fourth capacitor to develop a charge effective to substantially null the charge due to the non-linear capacitance characteristic of said first capacitor.

3. A circuit according to claim 2, wherein said first and second capacitors are both sensing capacitors, each having a non-linear capacitance characteristic, and wherein said environmental condition induces substantially opposite changes in capacitance in said first and in said second capacitors.

4. A circuit according to claim 3, wherein said first, second and third switching means are CMOS analog switches.

5. A circuit according to claim 4, wherein said feedback means develops a feedback signal which is applied to each of said first, second, third and fourth capacitors.

6. A circuit according to claim 2, wherein said first and second capacitors are formed by opposing sides of a sensing structure having a common diaphragm which moves in response to force or pressure to produce said changes in capacitance.

7. A circuit according to claim 1, wherein said feedback means includes means for sampling said junction voltage at a predetermined time after operation of said switching means.

8. A circuit according to claim 1, wherein said third capacitor has a value selected to compensate for leakage of said second capacitor.

9. A circuit according to claim 2, wherein said third and fourth capacitors have values to compensate for leakage of said second and first capacitors, respectively.

10. A circuit according to claim 2, wherein said feedback means provides a feedback signal which nulls the voltage present at the junction.

11. A circuit according to claim 1, wherein the feedback means develops a signal which is applied to each of said first, second and third capacitors by the respective switching means.

12. A circuit according to claim 1, wherein the third capacitor has a value approximately equal in magnitude to a leakage capacitance, and further comprising means for applying a fractional portion of said feedback signal to the third capacitor.

* * * * *